United States Patent
Miao et al.

(10) Patent No.: US 10,490,467 B2
(45) Date of Patent: Nov. 26, 2019

(54) METHODS OF FORMING A STACK OF MULTIPLE DEPOSITED SEMICONDUCTOR LAYERS

(71) Applicant: Applied Materials, Inc., Santa Clara, CA (US)

(72) Inventors: Liyan Miao, Sunnyvale, CA (US); Chentsau Ying, Cupertino, CA (US); Xinhai Han, Santa Clara, CA (US); Long Lin, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/026,598

(22) Filed: Jul. 3, 2018

(65) Prior Publication Data

US 2019/0013250 A1 Jan. 10, 2019

Related U.S. Application Data

(60) Provisional application No. 62/529,207, filed on Jul. 6, 2017.

(51) Int. Cl.
*H01L 21/66* (2006.01)
*H01L 21/3205* (2006.01)
(Continued)

(52) U.S. Cl.
CPC .............. *H01L 22/26* (2013.01); *C23C 16/24* (2013.01); *C23C 16/345* (2013.01);
(Continued)

(58) Field of Classification Search
None
See application file for complete search history.

(56) References Cited

U.S. PATENT DOCUMENTS

2006/0226518 A1* 10/2006 Masanobu ............ C23C 16/345
257/649
2010/0221869 A1* 9/2010 Schroeder ......... H01L 21/02381
438/104
(Continued)

FOREIGN PATENT DOCUMENTS

KR 10-2013-0007178 A 1/2013
WO 2006-127462 A1 11/2006

OTHER PUBLICATIONS

K. D. Mackenzie et al. "High Throughput Stress-Controlled Silicon Nitride Deposition for Compound Semiconductor Device Manufacturing" CS MANTECH Conference, 2012, pp. 1-3 See pp. 2-3 and figures 3, 5.
K. D. Mackenzie et al. "Stress Control of Si-Based PECVD Dielectrics" 207th Electrochemical Society Meeting, 2005, pp. 148-159 See figure 10.

*Primary Examiner* — Asok K Sarkar
(74) *Attorney, Agent, or Firm* — Kilpatrick Townsend & Stockton LLP

(57) ABSTRACT

Embodiments of the present technology may include a method of forming a stack of semiconductor layers. The method may include depositing a first silicon oxide layer on a substrate. The method may also include depositing a first silicon layer on the first silicon oxide layer. The method may further include depositing a first silicon nitride layer on the first silicon layer. Depositing the first silicon nitride layer or a stress layer may include reducing stress in at least one of the first silicon layer, the first silicon oxide layer, or the substrate. In addition, the method may include depositing a second silicon layer on the first silicon nitride layer. The operations may form the stack of semiconductor layers, where the stack includes the first silicon oxide layer, the first silicon layer, the first silicon nitride layer, and the second silicon layer.

12 Claims, 13 Drawing Sheets

(51) Int. Cl.
  *H01L 21/02* (2006.01)
  *C23C 16/40* (2006.01)
  *C23C 16/52* (2006.01)
  *C23C 16/34* (2006.01)
  *C23C 16/24* (2006.01)

(52) U.S. Cl.
  CPC ............ *C23C 16/401* (2013.01); *C23C 16/52* (2013.01); *H01L 21/0217* (2013.01); *H01L 21/02164* (2013.01); *H01L 21/02211* (2013.01); *H01L 21/02271* (2013.01); *H01L 21/02274* (2013.01); *H01L 21/32055* (2013.01); *H01L 22/12* (2013.01); *H01L 22/20* (2013.01)

(56) References Cited

U.S. PATENT DOCUMENTS

| | | | |
|---|---|---|---|
| 2014/0252502 A1* | 9/2014 | Grill | H01L 21/76283 |
| | | | 257/411 |
| 2015/0013607 A1* | 1/2015 | Haverkamp | C23C 16/24 |
| | | | 118/723 R |
| 2016/0225616 A1* | 8/2016 | Li | H01L 21/0217 |
| 2016/0260602 A1* | 9/2016 | Sreekala | C23C 16/24 |
| 2016/0329206 A1* | 11/2016 | Kumar | H01L 21/022 |
| 2017/0365561 A1* | 12/2017 | Shiu | G03F 7/094 |
| 2018/0233356 A1* | 8/2018 | Han | H01L 21/022 |
| 2018/0308976 A1* | 10/2018 | Lauer | H05K 999/99 |

\* cited by examiner

METHODS OF FORMING A STACK OF MULTIPLE DEPOSITED SEMICONDUCTOR LAYERS

CROSS-REFERENCES TO RELATED APPLICATIONS

This application claims the benefit of U.S. Provisional Application No. 62/529,207 by Miao et al., filed Jul. 6, 2017 and titled "METHODS OF FORMING A STACK OF MULTIPLE DEPOSITED SEMICONDUCTOR LAYERS," which is herein incorporated by reference in its entirety for all purposes.

TECHNICAL FIELD

Embodiments of the present technology relate to the field of semiconductor processing, including deposition technology.

BACKGROUND

Integrated circuits are made possible by processes which produce intricately patterned material layers on substrate surfaces. Producing patterned material on a substrate requires controlled methods for depositing material to be patterned. Physical, chemical, and plasma-enhanced deposition techniques are used to deposit different materials on substrates. In general, the layers should be deposited uniformly and smoothly across the substrate surface. In addition, different materials have different characteristics. Many layers of different materials can lead to different effects on the stack of layers or the substrate itself. These different effects can alter the performance and reliability of integrated circuits and other semiconductor devices. With shrinking dimensions of semiconductor devices, the deposited layers often have more stringent uniformity and roughness requirements. As a result, there is a need for improved systems and methods that can be used to produce high quality devices and structures. These and other needs are addressed by the present technology.

BRIEF SUMMARY

As semiconductor devices become smaller, patterning these devices may become more challenging. Smaller features may be harder to define. This may be a result of the decreased size or of more stringent tolerances needed for performance, reliability, and manufacturing throughput. Structures, such as 3D NAND, vertical NMOS, and vertical PMOS, may have thin layers of different semiconductor materials across a large portion of the wafer. The layers should be uniform and have minimal roughness. The methods described below may provide an improved deposition process for multiple layers of semiconductor materials in part by managing the stress resulting from different layers of materials.

Embodiments of the present technology may include a method of forming a stack of semiconductor layers. The method may include depositing a first silicon oxide layer on a substrate. The method may also include depositing a first silicon layer on the first silicon oxide layer. The method may include depositing a first silicon nitride layer on the first silicon layer. The method may further include depositing a second silicon layer on the first silicon nitride layer. In addition, the method may include depositing a stress layer on a side of the substrate opposite a side of the substrate with the first silicon oxide layer. The operations may form the stack of semiconductor layers, where the stack includes the first silicon oxide layer, the first silicon layer, the first silicon nitride layer, and the second silicon layer.

Embodiments of the present technology may include a method of forming a stack of semiconductor layers. The method may include depositing a first silicon oxide layer on a substrate. The method may also include depositing a first silicon layer on the first silicon oxide layer. The method may further include depositing a first silicon nitride layer on the first silicon layer. Depositing the first silicon nitride layer may include flowing a gas that includes helium and silane or disilane through a plasma to form plasma effluents. The plasma may be sustained with an RF power. Depositing the first silicon nitride layer may include reducing stress in at least one of the first silicon layer, the first silicon oxide layer, or the substrate. In addition, the method may include depositing a second silicon layer on the first silicon nitride layer. The operations may form the stack of semiconductor layers, where the stack includes the first silicon oxide layer, the first silicon layer, the first silicon nitride layer, and the second silicon layer.

Embodiments may include a method of managing stress in a silicon nitride layer on a semiconductor substrate. The method may include determining a target stress level in the silicon nitride layer. The method may also include determining a flowrate of helium and an RF power to achieve the target stress level using a calibration curve. The method may further include flowing helium at the flowrate and silane or disilane through a plasma with the RF power. In addition, the method may include depositing the silicon nitride layer on the semiconductor substrate.

DETAILED DESCRIPTION

Figure 1:
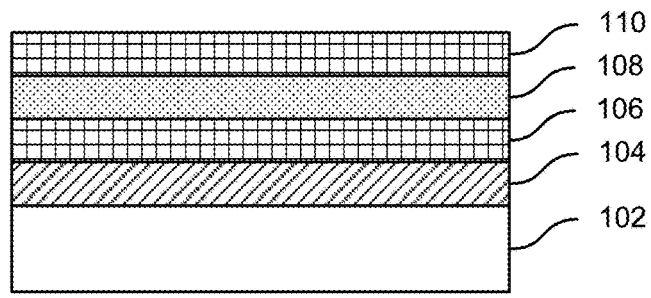
FIG. 1 shows a stack of semiconductor layers on a substrate according to embodiments of the present technology.

A stack of silicon oxide, polysilicon (or amorphous silicon, doped or undoped), silicon nitride, and polysilicon (or amorphous silicon) is called an OPNP stack. These OPNP stacks may be used for 3D NAND, vertical NMOS, vertical PMOS, and other semiconductor devices. FIG. 1 shows an example of an OPNP stack. The stack may include a substrate 102, which may be a semiconductor wafer, including a silicon wafer. A silicon oxide layer 104 is on top of substrate 102. On top of silicon oxide layer 104 is a polysilicon or amorphous silicon layer 106. On top of polysilicon or amorphous silicon layer 106 is a silicon nitride layer 108. On top of silicon nitride layer 108 is an additional polysilicon or amorphous silicon layer 110.

Figure 2:
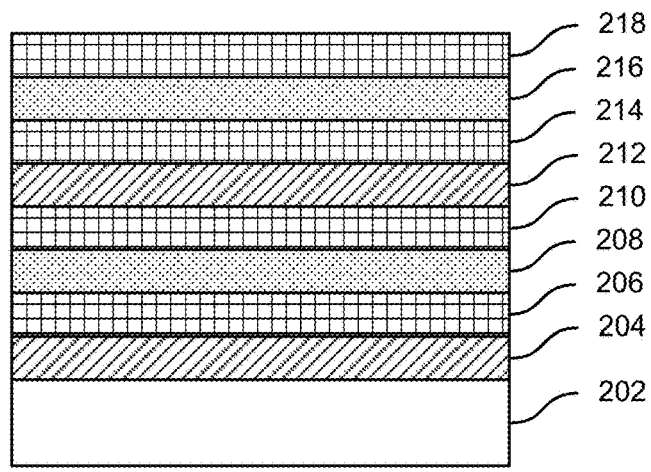
FIG. 2 shows a stack of semiconductor layers on a substrate according to embodiments of the present technology.

The OPNP stack may be repeated. For example, FIG. 2 shows two OPNP stacks. The layers in FIG. 2 are as follows: substrate 202, silicon oxide 204, polysilicon or amorphous silicon layer 206, silicon nitride 208, polysilicon or amorphous silicon layer 210, silicon oxide 212, polysilicon or amorphous silicon layer 214, silicon nitride 216, and polysilicon or amorphous silicon layer 218. FIG. 2 shows two stacks, but more than two OPNP stacks may be used.

These different layers in the OPNP stack cause stress on the wafer. The problem is exacerbated with multiple OPNP stacks. As a result of these stresses and other factors, conventional techniques result in wafer bow, which can lead to increased non-uniformity and surface roughness. Increased non-uniformity and surface roughness can lead to decreased device performance and reliability.

Embodiments of the present technology improve wafer bow, stress, uniformity, and roughness by managing the stress in the wafer. Some embodiments include depositing the layers with low pressure chemical vapor deposition (LPCVD). Other embodiments include depositing the layers with plasma enhanced chemical vapor deposition (PECVD).

I. LPCVD

A. Overview

Figure 3:
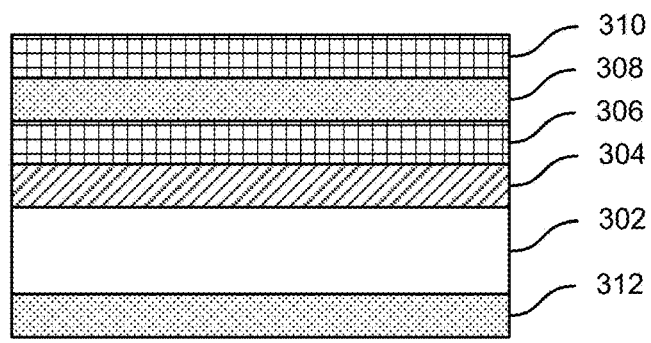
FIG. 3 shows a stack of semiconductor layers on a substrate with silicon nitride on the back side of the substrate according to embodiments of the present technology.

Low pressure chemical vapor deposition (LPCVD) may be used to deposit layers for an OPNP stack, similar to those shown in FIG. 1 and FIG. 2. Silicon oxide and silicon (whether polysilicon or amorphous silicon) layers may be compressive layers. Silicon nitride may be a tensile layer. The compressive stresses and the tensile stresses may not cancel out and result in a tensile force. As a result, the substrate or wafer may bow. To compensate for the stresses, LPCVD may be used to deposit a stress layer, which includes a silicon nitride layer or other tensile film on the back side of the wafer, resulting in a stack shown in FIG. 3. Other tensile films may include SACVD oxide and LPCVD SiON. FIG. 3 has a substrate 302 with an OPNP stack of a silicon oxide layer 304, a polysilicon or amorphous silicon layer 306, a silicon nitride layer 308, and a polysilicon or amorphous silicon layer 310. On the bottom of substrate 302 is a stress layer 312.

B. Method

Figure 4:
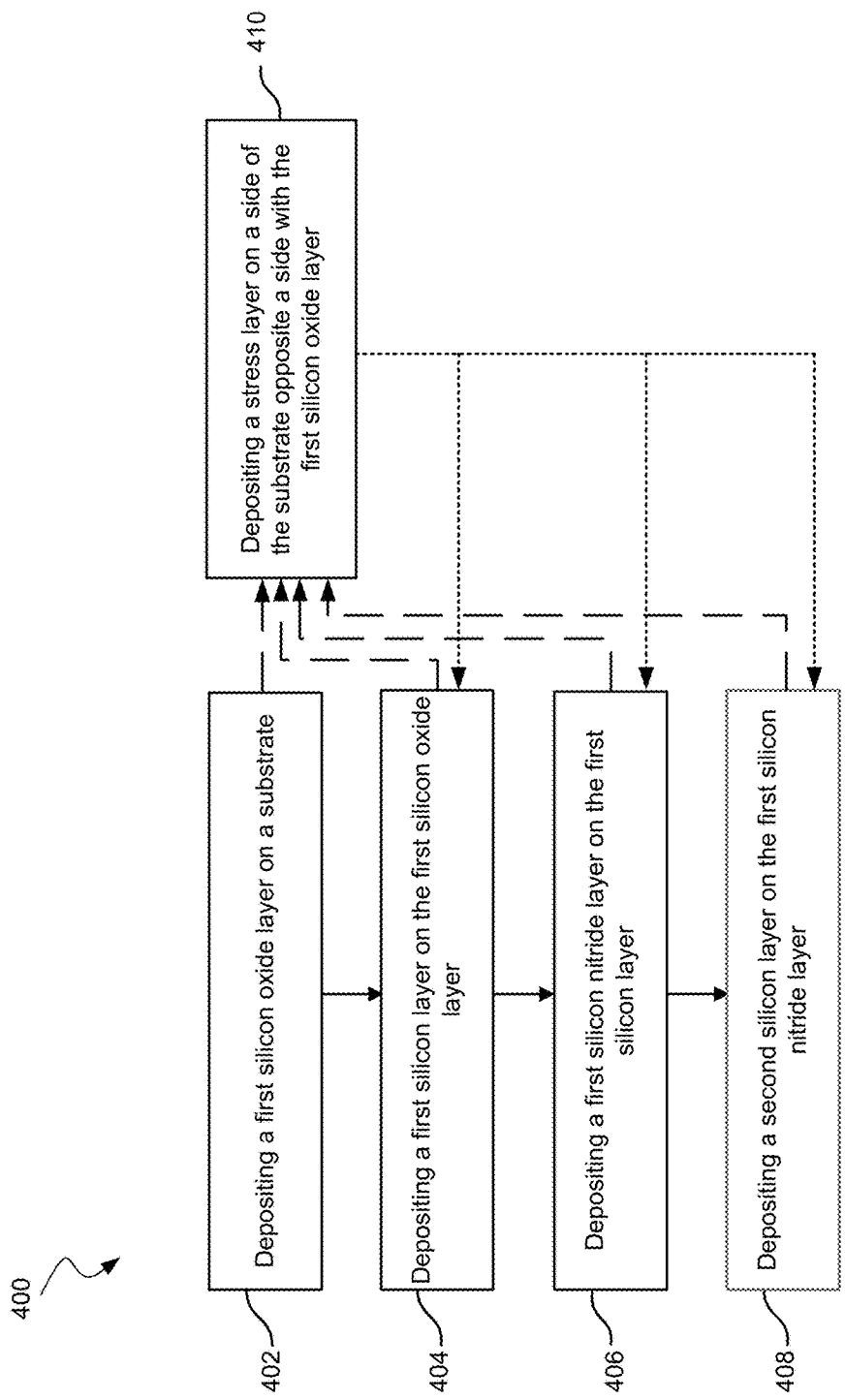
FIG. 4 shows a method of forming a stack of semiconductor layers according to embodiments of the present technology.

As shown in FIG. 4, embodiments of the present technology may include a method 400 of forming a stack of semiconductor layers. Method 400 may include depositing a first silicon oxide layer on a substrate (block 402). The substrate may be a semiconductor wafer, including a silicon wafer. In other embodiments, the substrate may include a wafer and additional layers on the wafer.

The first silicon oxide layer may be deposited on top of the substrate. The silicon oxide layer may include silicon dioxide. "Top" refers to the layer being deposited on the front side of the substrate and helps describe the orientation of the layers in the figures, but one of skill would recognize that "top" does not necessarily mean away from the center of the earth, as the substrate may be turned upside down. The first silicon oxide layer may be deposited to a thickness from 100 to 200 Angstroms, from 200 to 300 Angstroms, from 300 to 400 Angstroms, or over 400 Angstroms in embodiments. For example, the silicon oxide layer may be deposited to a thickness of 300 Angstroms. The first silicon oxide layer may be in contact with the substrate. The first silicon oxide layer may be deposited by low pressure chemical vapor deposition (LPCVD). All layers in the stack may be deposited by LPCVD and may exclude other deposition processes including PECVD.

Method 400 may also include depositing a first silicon layer on the first silicon oxide layer (block 404). The first silicon layer may be in contact with the first silicon oxide layer. The first silicon layer may be deposited by LPCVD. The first silicon layer may include polysilicon or amorphous silicon. The first silicon layer may be doped or undoped. The doping may be performed in situ with the deposition by LPCVD by adding a dopant gas, including $PH_3$, $B_2H_6$, or $AsH_3$. The first silicon layer may be deposited to a thickness from 100 to 200 Angstroms, from 200 to 300 Angstroms, from 300 to 400 Angstroms, or over 400 Angstroms in embodiments. For example, the first silicon layer may be deposited to a thickness of 300 Angstroms.

Method 400 may include depositing a first silicon nitride layer on the first silicon layer (block 406). The first silicon nitride may be a tensile layer, and create tensile stress. The first silicon nitride layer may be deposited with a low ammonia flow to lower the tensile stress. For example, the flow of ammonia may be reduced from around 5,500 sccm to 700 sccm to reduce the tensile strength by half. In other examples, the flow of ammonia may be reduced to a range from 500 to 600 sccm, 600 to 700 sccm, 700 to 800 sccm, 800 to 900 sccm, or 900 to 1,000 sccm. The silicon oxide layer and the silicon layer may be compressive layers. The first silicon nitride layer may be deposited to a thickness from 200 to 300 Angstroms, from 300 to 400 Angstroms, from 400 to 500 Angstroms, from 500 to 600 Angstroms, or over 600 Angstroms in embodiments. For example, the first silicon nitride layer may be deposited to a thickness of 500 Angstroms.

Method 400 may further include depositing a second silicon layer on the first silicon nitride layer (block 408). The second silicon layer may be in contact with the first silicon nitride layer. The second silicon layer may be deposited by LPCVD. The second silicon layer may be any material and thickness described for the first silicon layer. The second silicon layer may be the same or different from the first silicon layer.

In addition, method 400 may include depositing a stress layer on a side of the substrate opposite a side of the substrate with the first silicon oxide layer (block 410). In other words, the stress layer may be deposited on the back side of the substrate when the first silicon oxide layer is deposited on the front side of the substrate. The stress layer may be a second silicon nitride layer or another tensile layer. In some embodiments, the stress layer may be a compressive layer, but methods may exclude either tensile layers or compressive layers. In order to deposit the stress layer on the back side of the substrate, the substrate may be processed in a chamber upside down compared to conventional operation. In some embodiments, the substrate may be processed in a dedicated chamber or processing tool for back-side deposition. The stress layer may be in contact with the substrate. The stress layer may be deposited by LPCVD. The stress layer may be deposited to any thickness described for the first silicon nitride layer. The stress layer may have the same or different thickness as the first silicon nitride layer. Depositing the stress layer on the back side of the substrate may counteract the wafer bow created by layers on the front side of the substrate. For example, the layers on the front side of the substrate may create a tensile stress. The stress layer may also be tensile, but when deposited on the back side may pull the substrate to reduce the stress created by the front side layers.

Depositing the stress layer may be after the substrate is characterized by a bow exceeding a threshold value. Wafer bow may be the deviation of the center point of a median surface of an unclamped wafer from the median surface to the reference plane. The threshold value may be a value from +/−50 μm to +/−100 μm, from +/−100 μm to +/−150 μm, from 150 μm to 200 μm, or greater than 200 μm. For example, the threshold value may be 100 μm. After depositing the stress layer, the substrate may be characterized by a bow not exceeding the threshold value. In some embodiments, the wafer bow may be reduced by 100%, by 90%, by 80%, by 70%, by 60%, or by 50% compared to the bow before depositing the stress layer. In other embodiments, depositing the stress layer may result in a bow in the substrate in the opposite direction compared to before the stress layer was deposited.

Because depositing the stress layer may be based on a threshold value for wafer bow that may adversely affect deposition uniformity or other properties, depositing the stress layer may occur after any one of the layers is deposited. The different possibilities for depositing the stress layer are illustrated in FIG. 4 by dashed arrows. For example, depositing the second silicon layer as the stress layer may be after depositing the first silicon oxide layer and before depositing the first silicon nitride layer. As seen in this embodiment, "first" and "second" may be used to differentiate layers and not indicate the order of deposition. However, in some embodiments, "first" and "second" may indicate the order of deposition. For example, depositing the stress layer may be after depositing the first silicon nitride layer and before depositing the second silicon layer. In yet other embodiments, depositing the stress layer may be after depositing the second silicon layer and before a layer deposited on the second silicon layer. In further embodiments, the stress layer may be deposited after depositing the second silicon layer and before patterning the second silicon layer.

The operations may form the stack of semiconductor layers, where the stack includes the first silicon oxide layer, the first silicon layer, the first silicon nitride layer, and the second silicon layer. This stack may be the OPNP stack. In some embodiments, the stress layer may not be deposited until two, three, four, or more OPNP stacks are formed.

Method 400 may further include depositing a second silicon oxide layer on the second silicon layer. Method 400 may also include depositing a third silicon layer on the second silicon oxide layer. Method 400 may additionally include depositing a second silicon nitride layer on the third silicon layer. Furthermore, Method 400 may include depositing a fourth silicon layer on the second silicon nitride layer. Method 400 may also include depositing a second stress layer on the first stress layer previously deposited. The second stress layer may be any of the materials disclosed for the first stress layer. Depositing the second stress layer may be after the substrate is characterized by a bow exceeding the threshold value. The additional layers may then form two sets of OPNP stacks. Even more layers can be deposited to form multiple sets of OPNP stacks, which may number 3, 4, 5, 6, 7, 8, 9, 10, or more than 10. In some embodiments, eight OPNP stacks may have a thickness of about 1.2 μm.

Method 400 may include depositing the first silicon oxide layer, the first silicon nitride layer, and the stress layer in a first chamber of a processing tool. In addition, the method may include depositing the first silicon layer and the second silicon layer in a second chamber of the processing tool. In other words, depositing silicon oxide layers and silicon nitride layers may be in one chamber of the processing tool, while depositing silicon layers may be in another chamber of a processing tool. Method 400 may include removing the substrate from the processing tool. The processing tool may be an Applied Materials® Centura® system. After removal, the substrate may be at atmospheric pressure. The substrate may be transferred into a FOUP. The stack of semiconductor layers may then undergo patterning processes including photolithography and etching processes.

After depositing the second silicon layer, the substrate and the layers may have a standard deviation in uniformity of less than 3%, less than 2%, or less than 1% in embodiments. The wafer substrate bow may be less than 150 μm, less than 100 μm, or less than 50 μm in magnitude, either compressive or tensile. The adhesion may be better than 5 J/m$^2$, 6 J/m$^2$, 7 J/m$^2$, 8 J/m$^2$, 9 J/m$^2$, or 10 J/m$^2$ in embodiments. The roughness may be better than 2 nm RMS, 1.5 nm RMS, or 1 nm RMS as measured by atomic force microscopy (AFM). The silicon nitride may be have a high wet rate, (e.g., greater than 200 Å/min, 300 Å/min, or 400 Å/min) in hot phosphoric acid nitride bath to be able to selectively partially remove some of the silicon nitride layer in a later process if needed.

II. PECVD

A. Overview

Plasma enhanced chemical vapor deposition (PECVD) may be used instead of LPCVD to form a stack of semiconductor layers. PECVD may allow for all layers to be processed in a single chamber instead of multiple chambers. As a result, PECVD may be more efficient, cost effective, and have fewer defects. PECVD may also avoid handling the front side of a substrate. Instead of depositing a silicon nitride layer on the back side of a substrate, embodiments using PECVD may use different recipes to manage the stress caused by the silicon nitride layer. In this manner, wafer bow may be minimized. Including a helium flow while depositing silicon nitride and using a certain range of RF power was observed to affect the stress in the silicon nitride layer. In addition, a plasma with nitrogen and ammonia used when depositing silicon was observed to improve the adhesion of silicon to the underlying silicon nitride. All layers may be deposited with PECVD. Embodiments may exclude layers deposited with other methods, including LPCVD.

B. Example Method for Forming Stack

Figure 5:
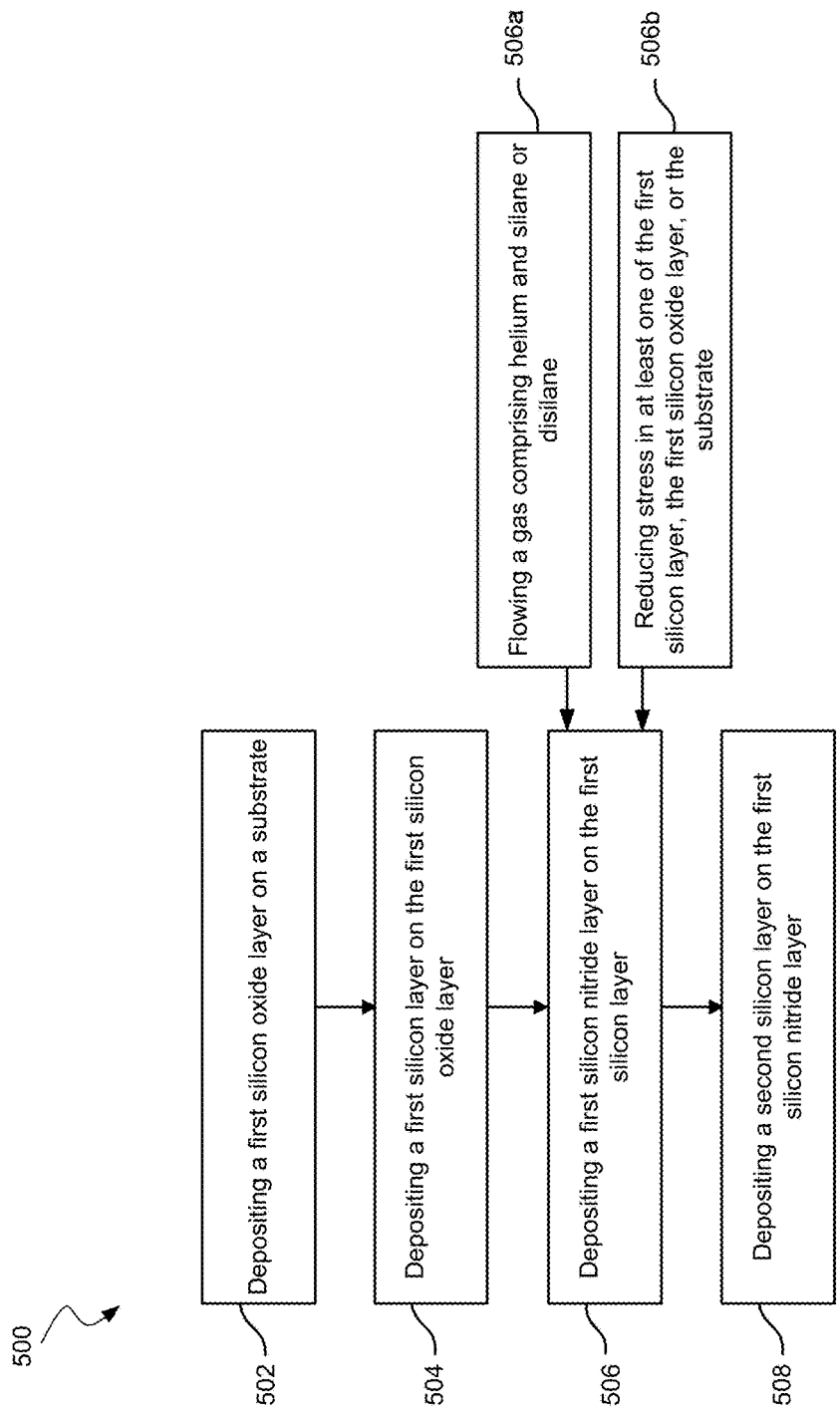
FIG. 5 shows a method of forming a stack of semiconductor layers according to embodiments of the present technology.

As shown in FIG. 5, embodiments of the present technology may include a method 500 of forming a stack of semiconductor layers. Method 500 may include depositing a first silicon oxide layer on a substrate (block 502). The substrate may be any substrate described herein. The first silicon oxide layer may be any silicon oxide layer described herein. The first silicon oxide layer may be deposited by PECVD.

Method 500 may also include depositing a first silicon layer on the first silicon oxide layer (block 504). The first silicon layer may be deposited by PECVD and may be any silicon layer described herein.

Method 500 may further include depositing a first silicon nitride layer on the first silicon layer (block 506). The first silicon nitride layer may be deposited by PECVD. The first silicon nitride layer may be deposited to any thickness described herein. Depositing the first silicon nitride layer may include flowing a gas that includes helium and silane or disilane, through a plasma to form plasma effluents (block 506*a*). The flowing gas may also include at least one of nitrogen or ammonia. In some embodiments, the gas may exclude one or more of the compounds. The helium may be flowed at a flow rate in a range from 1 slm (standard liter per minute) to 9 slm. In embodiments, the helium may be flowed at a rate in a range from 0.5 slm to 1 slm, 1 slm to 2 slm, 2 slm to 3 slm, 3 slm to 4 slm, 4 slm, to 5 slm, 5 slm to 6 slm, 6 slm to 7 slm, 7 slm to 8 slm, 8 slm to 9 slm, 9 slm to 10 slm, or more than 10 slm. The flow rate of silane may be from 50 sccm to 100 sccm, 100 sccm to 150 sccm, 150 sccm to 200 sccm, or greater than 200 sccm. The flow rate of silane may include about 112 sccm. The flow rate of nitrogen may be from 5,000 sccm to 10,000 sccm, from 10,000 sccm to 15,000 sccm, from 15,000 sccm to 20,000 sccm, or greater than 20,000 sccm. As an example, the flow rate of nitrogen may be about 10,0000 sccm. The flow rate of ammonia may be from 500 sccm to 1,000 sccm, from 1,000 sccm to 1,500 sccm, from 1,500 sccm to 2,000 sccm, or over 2,000 sccm. The flow rate of ammonia may be about 1,860 sccm.

The plasma may be sustained with an RF power. The RF power may be in a range from 200 W to 550 W, from 150 W to 200 W, from 200 W to 300 W, from 300 W to 400 W, from 400 W to 500 W, from 500 W to 600 W, or greater than 600 W. The RF power may be at 13.56 MHz.

Depositing the first silicon nitride layer may include reducing stress in at least one of the first silicon layer, the first silicon oxide layer, or the substrate (block 506*b*). The stress may be reduced overall for all the layers. The first silicon nitride layer may be characterized by a stress in a range from −1,500 MPa to 600 MPa, where a negative value refers to compressive stress, and a positive value refers to tensile stress. The stress of the first silicon nitride layer may be tuned to be more tensile, in order to counteract the compressive stress of the underlying layers. In embodiments, the silicon nitride layer may be deposited with lower RF power and lower helium flowrates. The bow may be reduced by any amount described herein. As an example, the bow before for eight OPNP stacks without managing stress using the silicon nitride embodiments may be near +150 μm, and the bow with depositing the stress layers with low RF power and low helium flow may be −70 μm.

The silicon nitride may be have a high wet rate (e.g., greater than 1,000 Å/min) in a hot phosphoric acid nitride bath to be able to selectively removed (fully or partially) some of the silicon nitride layer in later process if needed.

In addition, method 500 may include depositing a second silicon layer on the first silicon nitride layer (block 508). The second silicon layer may be any silicon layer and thickness described herein.

The operations may form the stack of semiconductor layers, where the stack includes the first silicon oxide layer, the first silicon layer, the first silicon nitride layer, and the second silicon layer. The operations may be repeated to form multiple stacks of the OPNP semiconductor layers, including any stacks described herein.

Depositing the first silicon oxide layer, the first silicon layer, the first silicon nitride layer, and the second silicon layer may be performed in the same chamber of a processing tool. The processing tool may be Applied Materials® Producer® system. Method 500 may further include removing the substrate from the chamber after depositing the second silicon layer and before any other depositing or patterning occurs. In embodiments where the OPNP stack is repeated, the substrate may be removed from the processing tool. after the OPNP stack is repeated and before any patterning processes on the stack. The substrate may be transferred into a FOUP. The stack of semiconductor layers may then undergo patterning processes.

After depositing the second silicon layer, the substrate and the layers may have a standard deviation in uniformity of less than 3%, less than 2%, or less than 1% in embodiments. The wafer substrate bow may be less than 150 μm, less than 100 μm, or less than 50 μm in magnitude, either compressive or tensile. The adhesion may be better than 5 J/m$^2$, 6 J/m$^2$, 7 J/m$^2$, 8 J/m$^2$, 9 J/m$^2$, or 10 J/m$^2$ in embodiments. The roughness may be better than 2 nm RMS, 1.5 nm RMS, 1 nm RMS, or 0.5 nm RMS as measured by (AFM).

C. Example Method for Managing Stress in Layer

Figure 6:
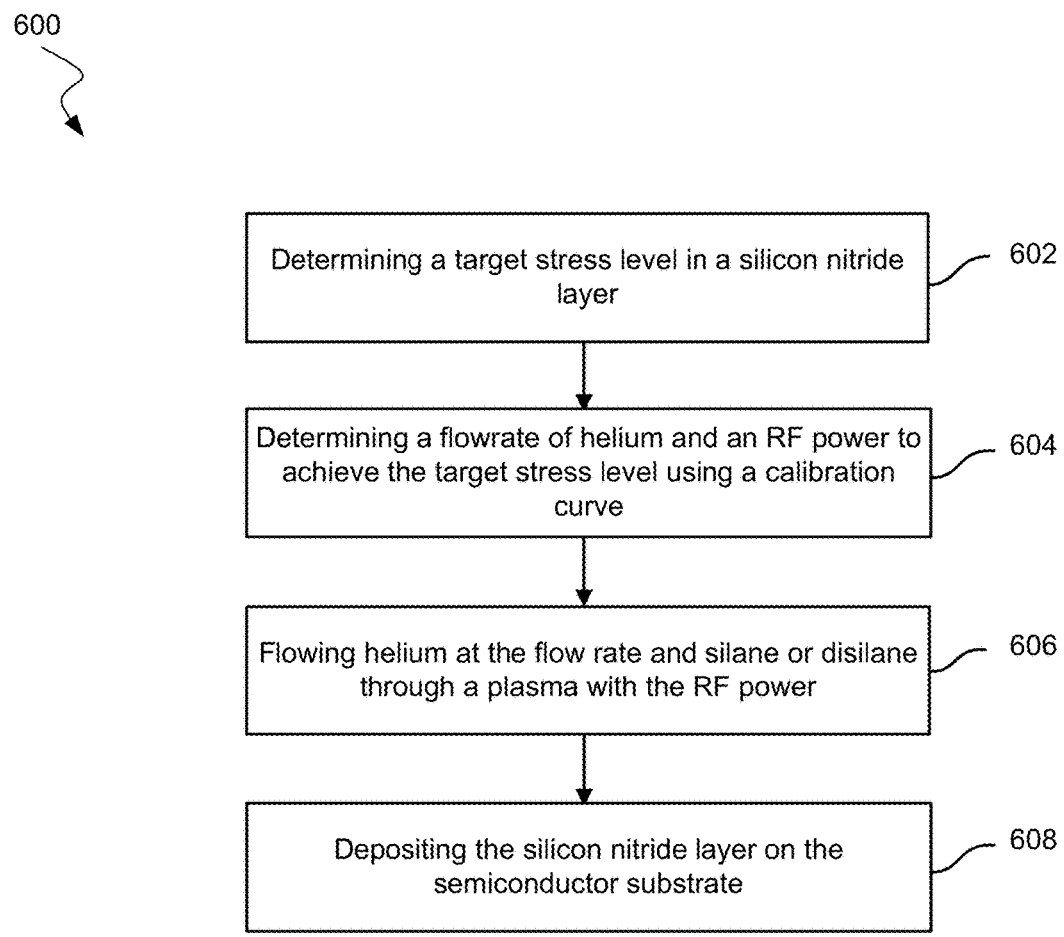
FIG. 6 shows a method of managing stress in a silicon nitride layer on a semiconductor substrate according to embodiments of the present technology.

As shown in FIG. 6, embodiments may include a method 600 of managing stress in a silicon nitride layer on a semiconductor substrate. The semiconductor substrate may include a silicon layer on a silicon oxide layer on a silicon substrate. The silicon substrate may be a silicon wafer. The silicon layer may be any silicon layer described herein. The silicon oxide layer may be any silicon oxide layer described herein.

Method 600 may include determining a target stress level in the silicon nitride layer (block 602). The target stress level may be in a range from −1,500 MPa to 600 MPa. The target stress level may be selected based on the thickness of all layers in the stack and the stress for other film layers. The stress in the layers may be measured or may be calculated, and the target stress level may be determined based on the stress for the other layers. PECVD oxide and amorphous silicon may be compressive layers and may be deposited to a predetermined thickness. The compressive stress for these oxide and silicon layers can be measured or calculated. The target stress level to cancel out the compressive stress can be calculated using the thickness of the silicon nitride to be deposited. The target stress level in the silicon nitride layer may be calculated with Stoney's Equation. The target stress level may be selected so as to minimize bow in the substrate after the entire dielectric stack is formed.

Method 600 may also include determining a flowrate of helium and an RF power to achieve the target stress level using a calibration curve (block 604). The calibration curve may include data from previous runs or experiments that relate stress in a silicon nitride layer to the flowrate of helium and/or the RF power used in the deposition process. The calibration curve may be in the form of a graph, a regression (e.g., a linear regression), an equation, or a set of data points. The calibration curve may need not be generated for each silicon nitride layer, and a previously generated calibration curve may be used for processing multiple substrates and/or multiple silicon nitride layers.

Method 600 may further include flowing helium at the flowrate, silane, nitrogen, and ammonium through a plasma with the RF power (block 606). The flowrate of the helium may be in any range described herein, including a range from 1 slm to 9 slm. The RF power may be in any range described herein, including a range from 200 to 550 W.

In addition, method 600 may include depositing the silicon nitride layer on the semiconductor substrate (block 608). The silicon nitride layer may be deposited by PECVD. The silicon nitride layer may be deposited to any thickness described herein. The silicon nitride layer, after deposited on the semiconductor substrate, may be characterized by a stress level that is the same as the target stress level, or within 5%, 10%, 15%, 20%, or 25% of the target stress level.

Method 600 may also include depositing a silicon layer on the silicon nitride layer. The silicon layer may be any silicon layer described herein.

EXAMPLES

Example 1

Figure 7:
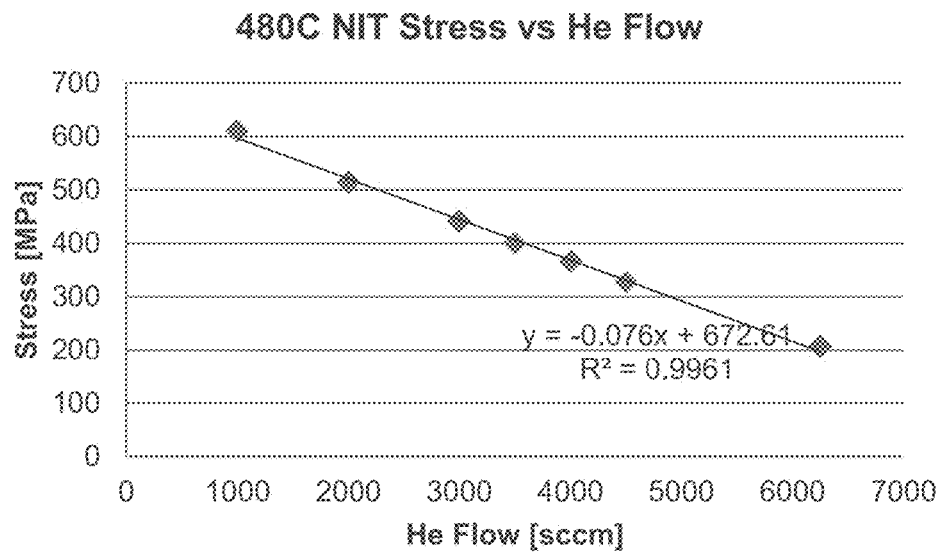
FIG. 7 shows a graph of stress versus helium flow according to embodiments of the present technology.

The stress level in a silicon nitride level was measured for different helium flowrates. The helium flowrate was varied from 1,000 sccm to 6,250 sccm. The RF power was constant at 250 W, the temperature was constant at 480° C., the silane flow was 112 sccm, the nitrogen flow was 10,000 sccm, and the ammonia flow was 1,860 sccm. The thickness of the deposited silicon nitride layer ranged from about 1,800 Angstroms to about 2,000 Angstroms. The resulting stress in the nitride layer is shown in FIG. 7. The stress ranged from about 200 MPa to about 600 MPa. Higher levels of helium flow resulted in less stress.

Example 2

Figure 8:
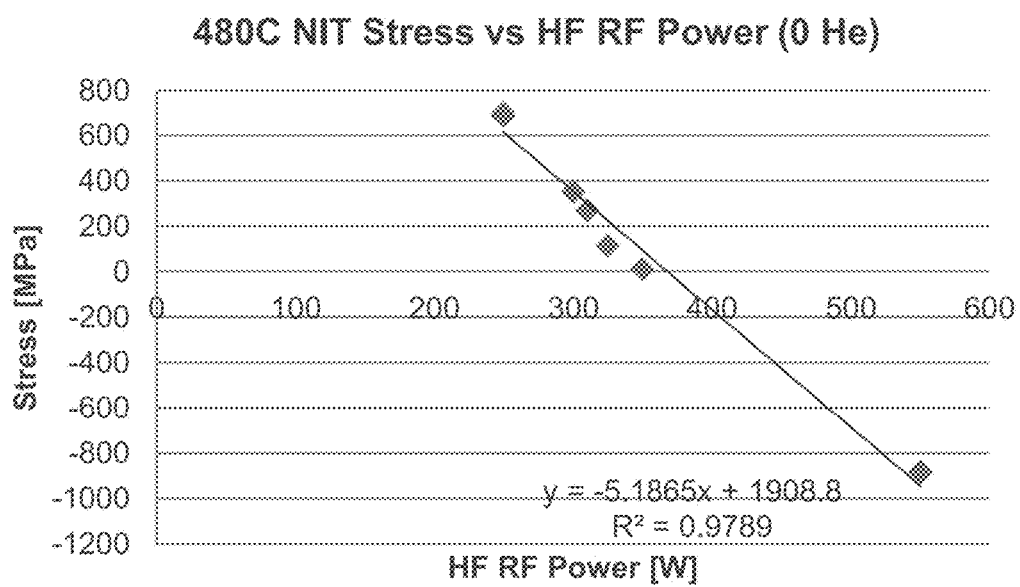
FIG. 8 shows a graph of stress versus RF power according to embodiments of the present technology.

The stress level in a silicon nitride level was measured for different RF power without a helium flowrate. The RF power was varied from 250 W to 550 W. The helium flowrate was fixed at 0 sccm, the temperature was constant at 480° C., the silane flow was 112 sccm, the nitrogen flow was 10,000 sccm, and the ammonia flow was 1,860 sccm. The thickness of the deposited silicon nitride layer ranged from about 2,000 Angstroms to about 3,700 Angstroms. The resulting stress in the nitride layer is shown in FIG. 8. The stress ranged from about −880 MPa to about 700 MPa. Higher RF power resulted in a lower level of absolute stress. Stress with the smallest magnitude was observed to be at about 350 W.

Example 3

Figure 9:
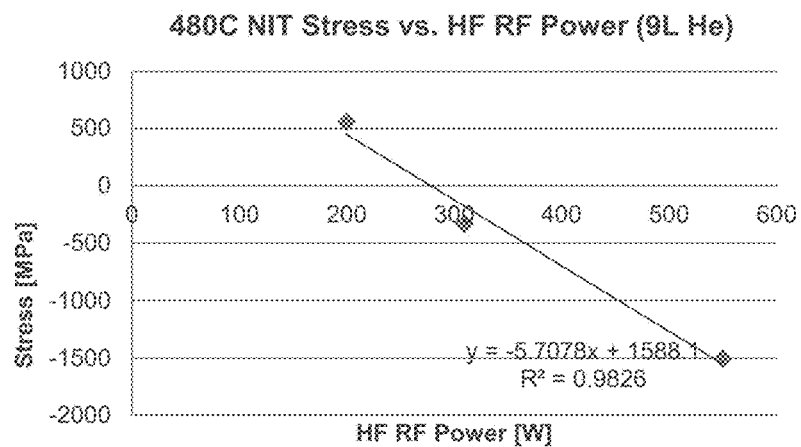
FIG. 9 shows a graph of stress versus RF power according to embodiments of the present technology.

The stress level in a silicon nitride level was measured for different RF power at a helium flowrate of 9,000 sccm. The RF power was varied from 200 W to 550 W. The helium rate was fixed at 9,000 sccm, the temperature was constant at 480° C., the silane flow was 112 sccm, the nitrogen flow was 10,000 sccm, and the ammonia flow was 1,860 sccm. The thickness of the deposited silicon nitride layer ranged from about 1,500 Angstroms to about 2,900 Angstroms. The resulting stress in the nitride layer is shown in FIG. 9. The stress ranged from about −1,500 MPa to about 550 MPa. Higher RF power resulted in a lower level of absolute stress. The trend for lower stress with higher RF power is present with both no flow of He and a 9,000 sccm flowrate of helium. As seen in FIG. 8 and FIG. 9, the additional flowrate of helium lowered the stress in the silicon nitride layer further.

Example 4

Figure 10A:
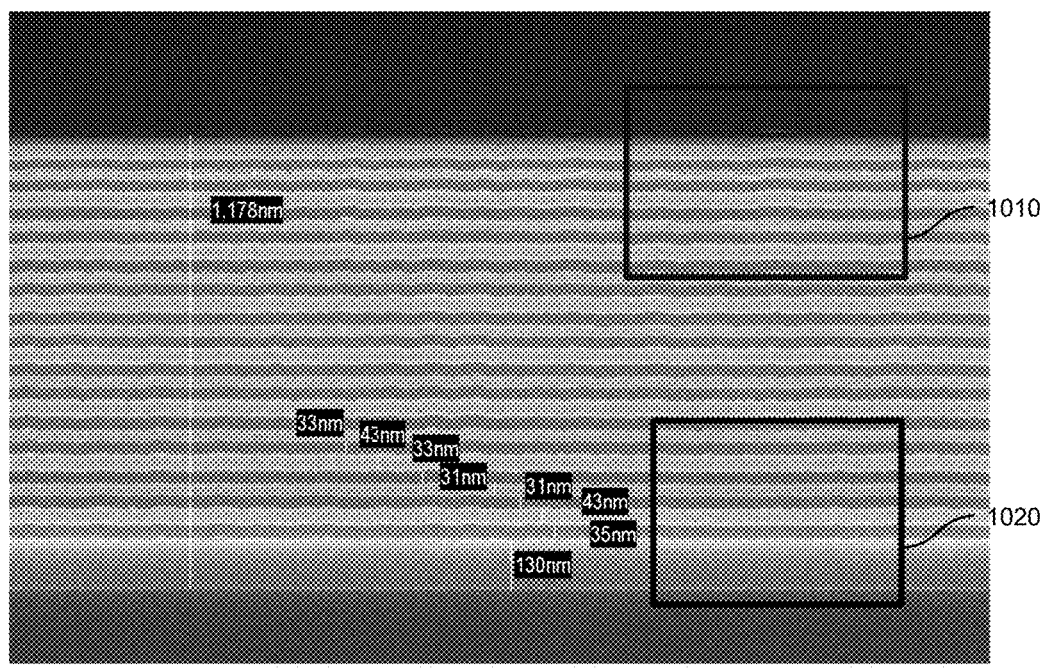
FIGS. 10A, 10B, and 10C show scanning electron microscope (SEM) images of semiconductor layers according to embodiments of the present technology.
Figure 10B:
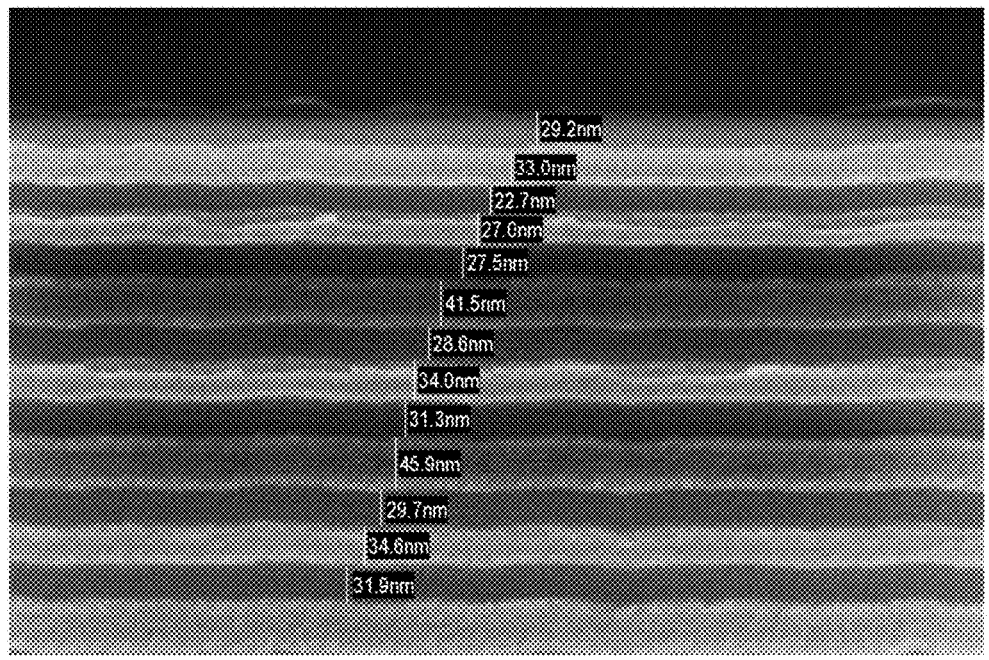
Figure 10C:
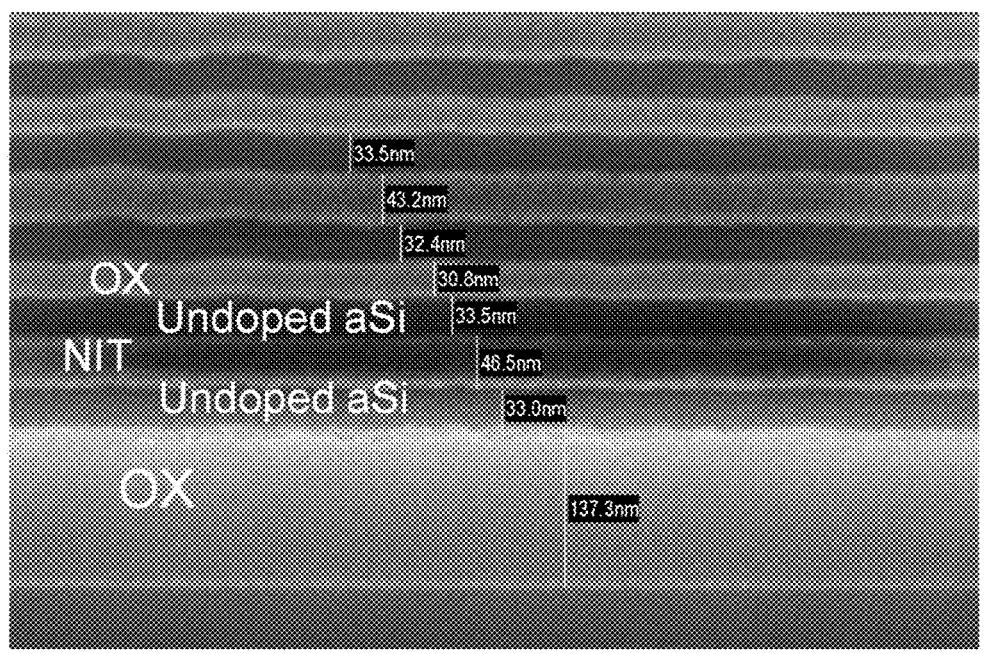

FIG. 10A, FIG. 10B, and FIG. 10C show cross-section scanning electron microscope (SEM) images of eight sets of OPNP layers deposited with PECVD according to embodiments of the present technology. The RF power was 250 W. The flowrate of helium was 6,250 sccm. The repeated stack was 300 Angstroms of undoped amorphous silicon on 500 Angstroms of silicon nitride on 300 Angstroms of undoped amorphous silicon on top of 300 Angstroms of silicon oxide. The top layers in rectangle 1010 in FIG. 10A are imaged in FIG. 10B. The bottom layers in rectangle 1020 in FIG. 10A are imaged in FIG. 10C. The estimated standard deviation for uniformity was 1.33%.

Example 5

Figure 11A:
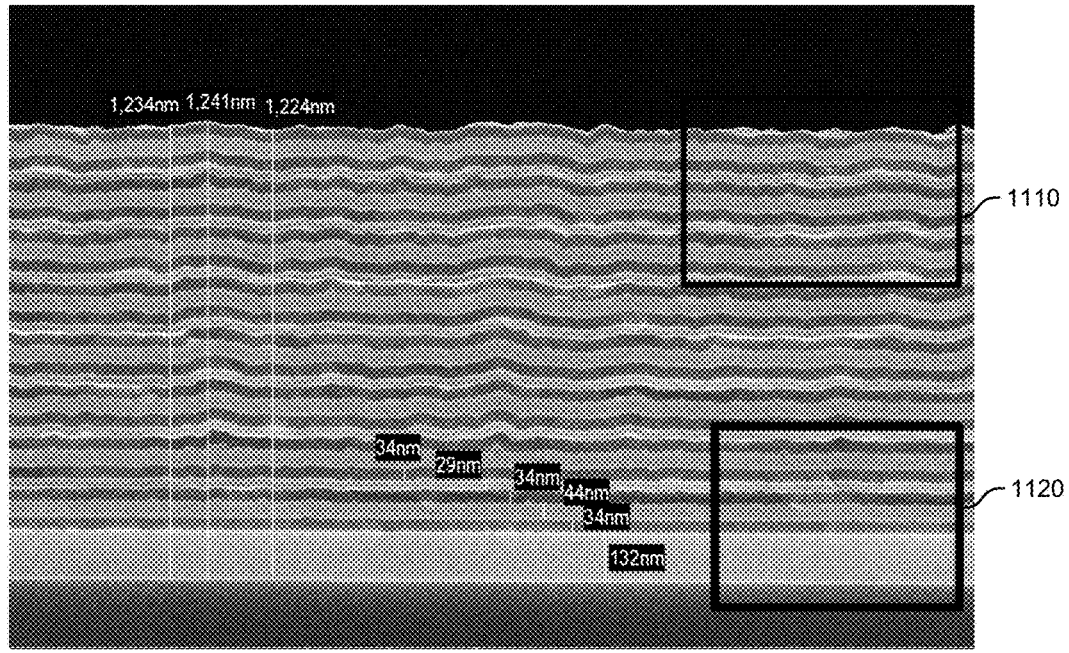
FIGS. 11A, 11B, and 11C show SEM images of semiconductor layers according to embodiments of the present technology.
Figure 11B:
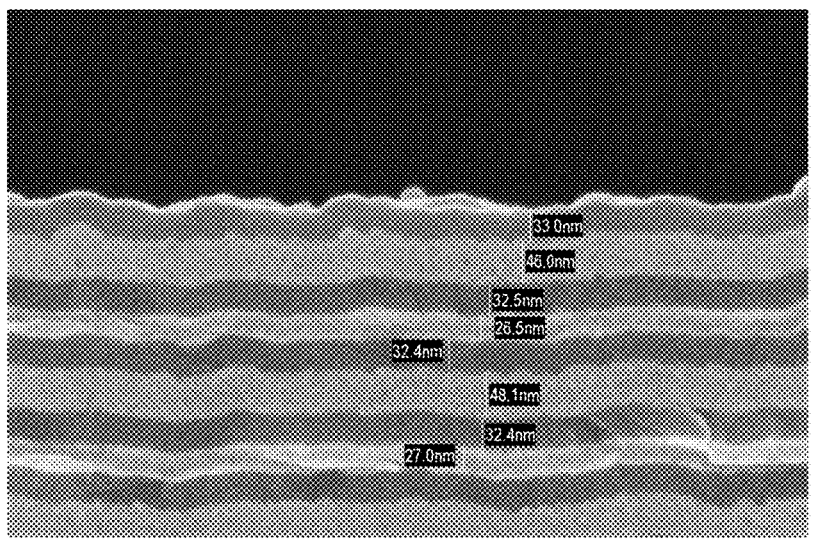
Figure 11C:
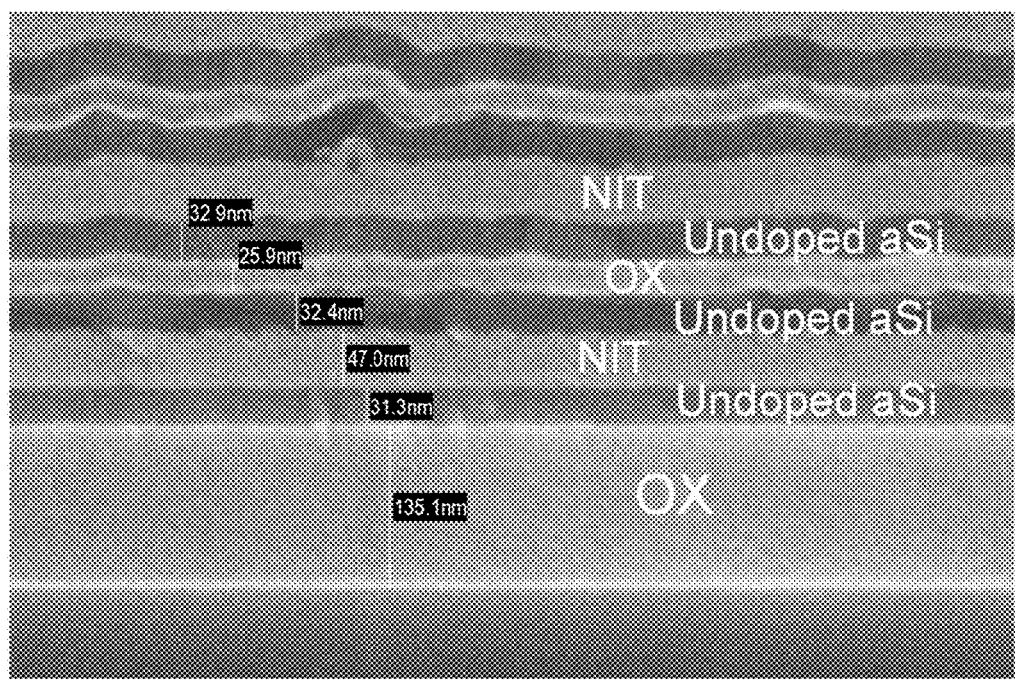

FIG. 11A, FIG. 11B, and FIG. 11C show cross-section SEM images of eight sets of OPNP layers deposited with LPCVD according to embodiments of the present technology. The repeated stack was 300 Angstroms of undoped amorphous silicon on 500 Angstroms of silicon nitride on 300 Angstroms of undoped amorphous silicon on top of 300 Angstroms of silicon oxide. After depositing two sets of OPNP layers on the front side, 1,000 Angstroms of silicon nitride were deposited on the back side. For the eight sets of OPNP layers, the wafer was flipped a total of three times and 1,000 Angstroms of silicon nitride was deposited three times. The top layers in rectangle 1110 in FIG. 11A are imaged in FIG. 11B. The bottom layers in rectangle 1120 in FIG. 11A are imaged in FIG. 11C. The estimated standard deviation for uniformity was 2.75%. The stack deposited by PECVD in FIG. 10A, FIG. 10B, and FIG. 10C had better uniformity and roughness than the stack deposited by LPCVD in FIG. 11A, FIG. 11B, and FIG. 11C. Part of the worse uniformity and roughness with LPCVD was the presence of particles in the stack. Without these particle defects, the uniformity and roughness with LPCVD would be improved, though probably still not to the level of PECVD.

III. Systems

A. LPCVD

Figure 12:
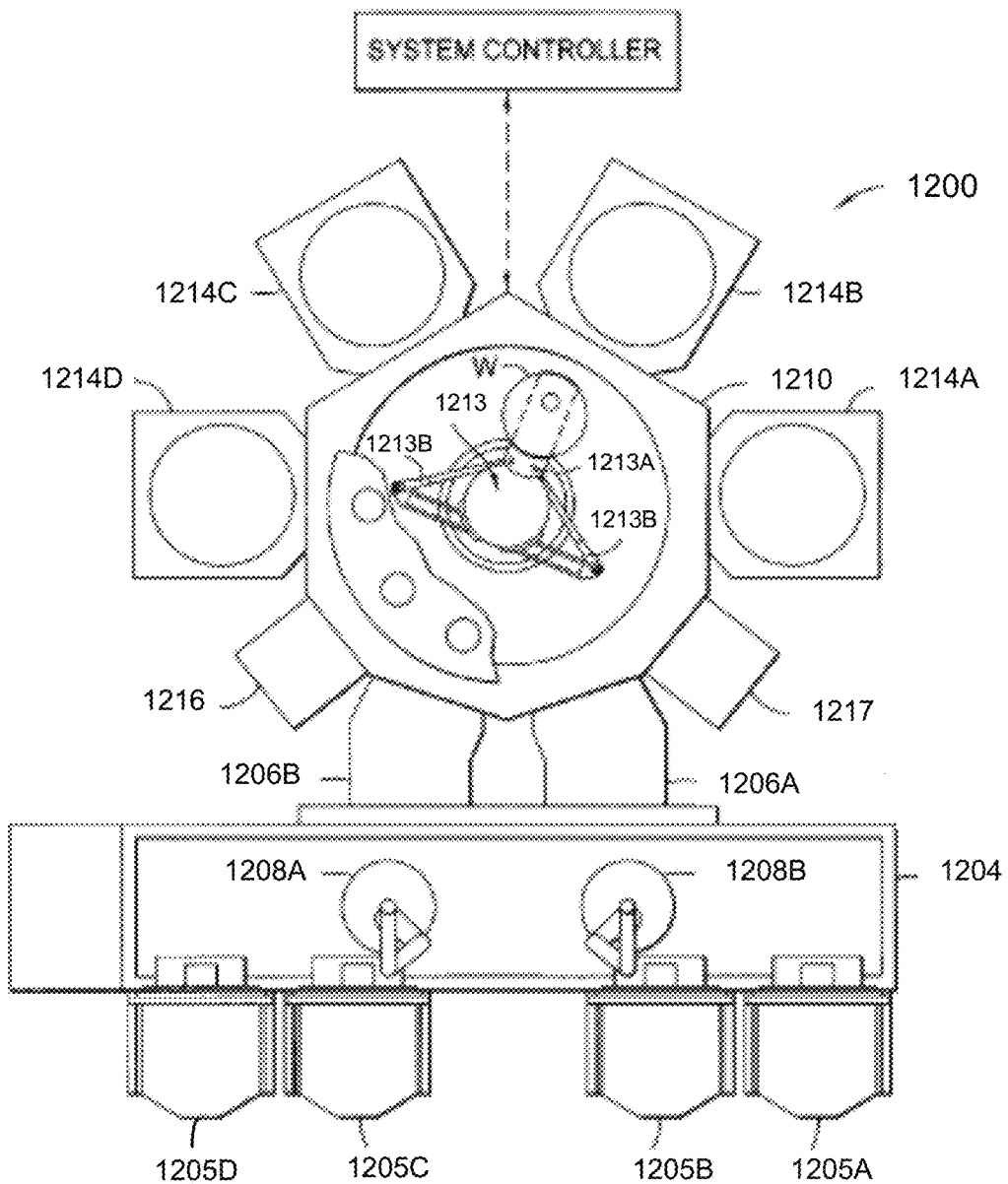
FIG. 12 shows a top plan view of an exemplary processing system according to the present technology.

FIG. 12 shows a top plan view of one embodiment of a processing system 1200 of deposition, etching, baking, and curing chambers according to embodiments. The processing system 1200 depicted in FIG. 12 may contain a plurality of process chambers, 1214A-D, a transfer chamber 1210, a service chamber 1216, an integrated metrology chamber 1217, and a pair of load lock chambers 1206A-B. The process chambers may include structures or components similar to those described in relation to LPCVD, as well as additional processing chambers.

To transport substrates among the chambers, the transfer chamber 1210 may contain a robotic transport mechanism 1213. The transport mechanism 1213 may have a pair of substrate transport blades 1213A attached to the distal ends of extendible arms 1213B, respectively. The blades 1213A may be used for carrying individual substrates to and from the process chambers. In operation, one of the substrate transport blades such as blade 1213A of the transport mechanism 1213 may retrieve a substrate W from one of the load lock chambers such as chambers 1206A-B and carry substrate W to a first stage of processing, for example, an etching process as described below in chambers 1214A-D. If the chamber is occupied, the robot may wait until the processing is complete and then remove the processed substrate from the chamber with one blade 1213A and may insert a new substrate with a second blade (not shown). Once the substrate is processed, it may then be moved to a second stage of processing. For each move, the transport mechanism 1213 generally may have one blade carrying a substrate and one blade empty to execute a substrate exchange. The transport mechanism 1213 may wait at each chamber until an exchange can be accomplished.

Once processing is complete within the process chambers, the transport mechanism 1213 may move the substrate W from the last process chamber and transport the substrate W to a cassette within the load lock chambers 1206A-B. From the load lock chambers 1206A-B, the substrate may move into a factory interface 1204. The factory interface 1204 generally may operate to transfer substrates between pod loaders 1205A-D in an atmospheric pressure clean environment and the load lock chambers 1206A-B. The clean environment in factory interface 1204 may be generally provided through air filtration processes, such as HEPA filtration, for example. Factory interface 1204 may also include a substrate orienter/aligner (not shown) that may be used to properly align the substrates prior to processing. At least one substrate robot, such as robots 1208A-B, may be positioned in factory interface 1204 to transport substrates between various positions/locations within factory interface 1204 and to other locations in communication therewith. Robots 1208A-B may be configured to travel along a track system within factory interface 1204 from a first end to a second end of the factory interface 1204.

The processing system 1200 may further include an integrated metrology chamber 1217 to provide control signals, which may provide adaptive control over any of the processes being performed in the processing chambers. The integrated metrology chamber 1217 may include any of a variety of meteorological devices to measure various film properties, such as thickness, roughness, composition, and the metrology devices may further be capable of characterizing grating parameters such as critical dimensions, sidewall angle, and feature height under vacuum in an automated manner.

Figure 13:
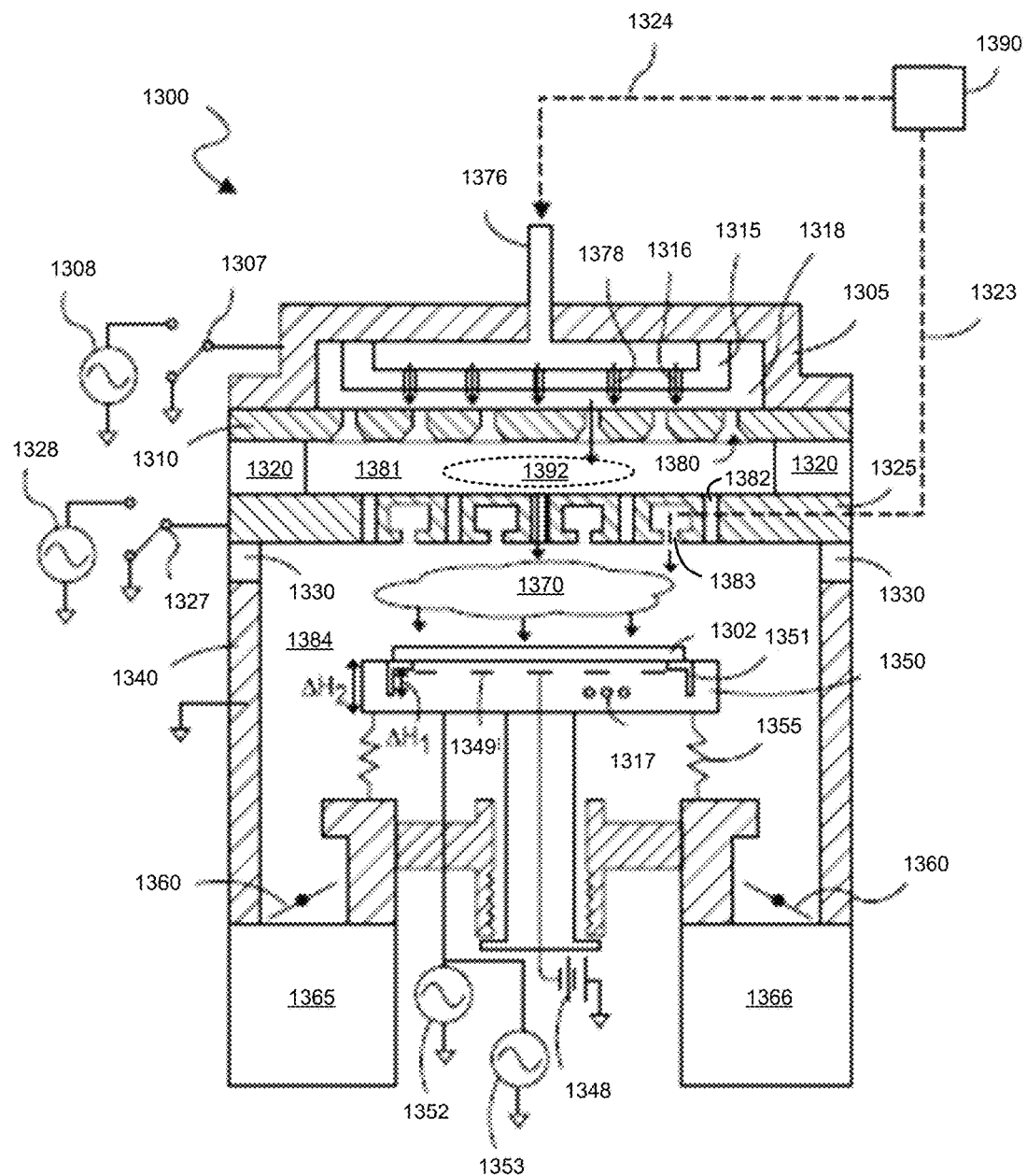
FIG. 13 shows a schematic cross-sectional view of an exemplary processing chamber according to the present technology.

Turning now to FIG. 13 is shown a cross-sectional view of an exemplary process chamber system 1300 according to the present technology. Chamber 1300 may be used, for example, in one or more of the processing chamber sections 1214 of the system 1200 previously discussed. Generally, the etch chamber 1300 may include a first capacitively-coupled plasma source to implement an ion milling operation and a second capacitively-coupled plasma source to implement a deposition operation and to implement an optional etching operation. The chamber 1300 may include grounded chamber walls 1340 surrounding a chuck 1350. In embodiments, the chuck 1350 may be an electrostatic chuck that clamps the substrate 1302 to a top surface of the chuck 1350 during processing, though other clamping mechanisms as would be known may also be utilized. The chuck 1350 may include an embedded heat exchanger coil 1317. In the exemplary embodiment, the heat exchanger coil 1317 includes one or more heat transfer fluid channels through which heat transfer fluid, such as an ethylene glycol/water mix, may be passed to control the temperature of the chuck 1350 and ultimately the temperature of the substrate 1302.

The chuck 1350 may include a mesh 1349 coupled to a high voltage DC supply 1348 so that the mesh 1349 may carry a DC bias potential to implement the electrostatic clamping of the substrate 1302. The chuck 1350 may be coupled with a first RF power source and in one such embodiment, the mesh 1349 may be coupled with the first RF power source so that both the DC voltage offset and the RF voltage potentials are coupled across a thin dielectric layer on the top surface of the chuck 1350. In the illustrative embodiment, the first RF power source may include a first and second RF generator 1352, 1353. The RF generators 1352, 1353 may operate at any industrially utilized frequency, however in the exemplary embodiment the RF generator 1352 may operate at 60 MHz to provide advantageous directionality. Where a second RF generator 1353 is also provided, the exemplary frequency may be 2 MHz.

With the chuck 1350 to be RF powered, an RF return path may be provided by a first showerhead 1325. The first showerhead 1325 may be disposed above the chuck to distribute a first feed gas into a first chamber region 1384 defined by the first showerhead 1325 and the chamber wall 1340. As such, the chuck 1350 and the first showerhead 1325 form a first RF coupled electrode pair to capacitively energize a first plasma 1370 of a first feed gas within a first chamber region 1384. A DC plasma bias, or RF bias, resulting from capacitive coupling of the RF powered chuck may generate an ion flux from the first plasma 1370 to the substrate 1302, e.g., Ar ions where the first feed gas is Ar, to provide an ion milling plasma. The first showerhead 1325 may be grounded or alternately coupled with an RF source 1328 having one or more generators operable at a frequency other than that of the chuck 1350, e.g., 13.56 MHz or 60 MHz. In the illustrated embodiment the first showerhead 1325 may be selectably coupled to ground or the RF source 1328 through the relay 1327 which may be automatically controlled during the etch process, for example by a controller (not shown). In disclosed embodiments, chamber 1300 may not include showerhead 1325 or dielectric spacer 1320, and may instead include only baffle 1315 and showerhead 1310 described further below.

As further illustrated in the figure, the etch chamber 1300 may include a pump stack capable of high throughput at low process pressures. In embodiments, at least one turbo molecular pump 1365, 1366 may be coupled with the first chamber region 1384 through one or more gate valves 1360 and disposed below the chuck 1350, opposite the first showerhead 1325. The turbo molecular pumps 1365, 1366 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 1350 may form part of a pedestal which is centered between the two turbo pumps 1365 and 1366, however in alternate configurations chuck 1350 may be on a pedestal cantilevered from the chamber wall 1340 with a single turbo molecular pump having a center aligned with a center of the chuck 1350.

Disposed above the first showerhead 1325 may be a second showerhead 1310. In one embodiment, during processing, the first feed gas source, for example, argon delivered from gas distribution system 1390 may be coupled with a gas inlet 1376, and the first feed gas flowed through a plurality of apertures 1380 extending through second showerhead 1310, into the second chamber region 1381, and through a plurality of apertures 1382 extending through the first showerhead 1325 into the first chamber region 1384. An additional flow distributor or baffle 1315 having apertures 1378 may further distribute a first feed gas flow 1316 across the diameter of the etch chamber 1300 through a distribution region 1318. In an alternate embodiment, the first feed gas may be flowed directly into the first chamber region 1384 via apertures 1383 which are isolated from the second chamber region 1381 as denoted by dashed line 1323.

The chamber 1300 may be configured to perform a deposition operation. A plasma 1392 may be generated in the second chamber region 1381 by an RF discharge which may be implemented in any of the manners described for the second plasma 1392. Where the first showerhead 1325 is powered to generate the plasma 1392 during a deposition, the first showerhead 1325 may be isolated from a grounded chamber wall 1340 by a dielectric spacer 1330 so as to be electrically floating relative to the chamber wall. In the exemplary embodiment, an oxidizer feed gas source, such as molecular oxygen, may be delivered from gas distribution system 1390, and coupled with the gas inlet 1376. In embodiments where the first showerhead 1325 is a multi-channel showerhead, any silicon-containing precursor, such as OMCTS for example, may be delivered from gas distribution system 1390, and directed into the first chamber region 1384 to react with reactive species passing through the first showerhead 1325 from the plasma 1392. Alternatively the silicon-containing precursor may also be flowed through the gas inlet 1376 along with the oxidizer.

Chamber 1300 may additionally be reconfigured from the state illustrated to perform an etching operation. A secondary electrode 1305 may be disposed above the first showerhead 1325 with a second chamber region 1381 there between. The secondary electrode 1305 may further form a lid or top plate of the etch chamber 1300. The secondary electrode 1305 and the first showerhead 1325 may be electrically isolated by a dielectric ring 1320 and form a second RF coupled electrode pair to capacitively discharge a second plasma 1392 of a second feed gas within the second chamber region 1381. Advantageously, the second plasma 1392 may not provide a significant RF bias potential on the chuck 1350. At least one electrode of the second RF coupled electrode pair may be coupled with an RF source for energizing an etching plasma. The secondary electrode 1305 may be electrically coupled with the second showerhead 1310. In an exemplary embodiment, the first showerhead 1325 may be coupled with a ground plane or floating and may be coupled to ground through a relay 1327 allowing the first showerhead 1325 to also be powered by the RF power source 1328 during the ion milling mode of operation. Where the first showerhead 1325 is grounded, an RF power source 1308, having one or more RF generators operating at 13.56 MHz or 60 MHz, for example, may be coupled with the secondary electrode 1305 through a relay 1307 which may allow the secondary electrode 1305 to also be grounded during other operational modes, such as during an ion milling operation, although the secondary electrode 1305 may also be left floating if the first showerhead 1325 is powered.

A second feed gas source, such as nitrogen trifluoride, and a hydrogen source, such as ammonia, may be delivered from gas distribution system 1390, and coupled with the gas inlet 1376 such as via dashed line 1324. In this mode, the second feed gas may flow through the second showerhead 1310 and may be energized in the second chamber region 1381. Reactive species may then pass into the first chamber region 1384 to react with the substrate 1302. As further illustrated, for embodiments where the first showerhead 1325 is a multi-channel showerhead, one or more feed gases may be provided to react with the reactive species generated by the second plasma 1392. In one such embodiment, a water source may be coupled with the plurality of apertures 1383. Additional configurations may also be based on the general illustration provided, but with various components reconfigured. For example, flow distributor or baffle 1315 may be a plate similar to the second showerhead 1310, and may be positioned between the secondary electrode 1305 and the second showerhead 1310. As any of these plates may operate as an electrode in various configurations for producing plasma, one or more annular or other shaped spacer may be positioned between one or more of these components, similar to dielectric ring 1320. Second showerhead 1310 may also operate as an ion suppression plate in embodiments, and may be configured to reduce, limit, or suppress the flow of ionic species through the second showerhead 1310, while still allowing the flow of neutral and radical species. One or more additional showerheads or distributors may be included in the chamber between first showerhead 1325 and chuck 1350. Such a showerhead may take the shape or structure of any of the distribution plates or structures previously described. Also, in embodiments a remote plasma unit (not shown) may be coupled with the gas inlet to provide plasma effluents to the chamber for use in various processes.

In an embodiment, the chuck 1350 may be movable along the distance H2 in a direction normal to the first showerhead 1325. The chuck 1350 may be on an actuated mechanism surrounded by a bellows 1355, or the like, to allow the chuck 1350 to move closer to or farther from the first showerhead 1325 as a means of controlling heat transfer between the chuck 1350 and the first showerhead 1325, which may be at an elevated temperature of 80° C.-150° C., or more. As such, an etch process may be implemented by moving the chuck 1350 between first and second predetermined positions relative to the first showerhead 1325. Alternatively, the chuck 1350 may include a lifter 1351 to elevate the substrate 1302 off a top surface of the chuck 1350 by distance H1 to control heating by the first showerhead 1325 during the etch process. In other embodiments, where the etch process is performed at a fixed temperature such as about 90-110° C. for example, chuck displacement mechanisms may be avoided. A system controller (not shown) may alternately energize the first and second plasmas 1370 and 1392 during the etching process by alternately powering the first and second RF coupled electrode pairs automatically.

Chamber 1300 is included as a general chamber configuration that may be utilized for various operations discussed in reference to the present technology. The chamber is not to be considered limiting to the technology, but instead to aid in understanding of the processes described. Several other chambers known in the art or being developed may be utilized with the present technology including any chamber produced by Applied Materials Inc. of Santa Clara, Calif., or any chamber that may perform the techniques described herein.

B. PECVD

Figure 14:
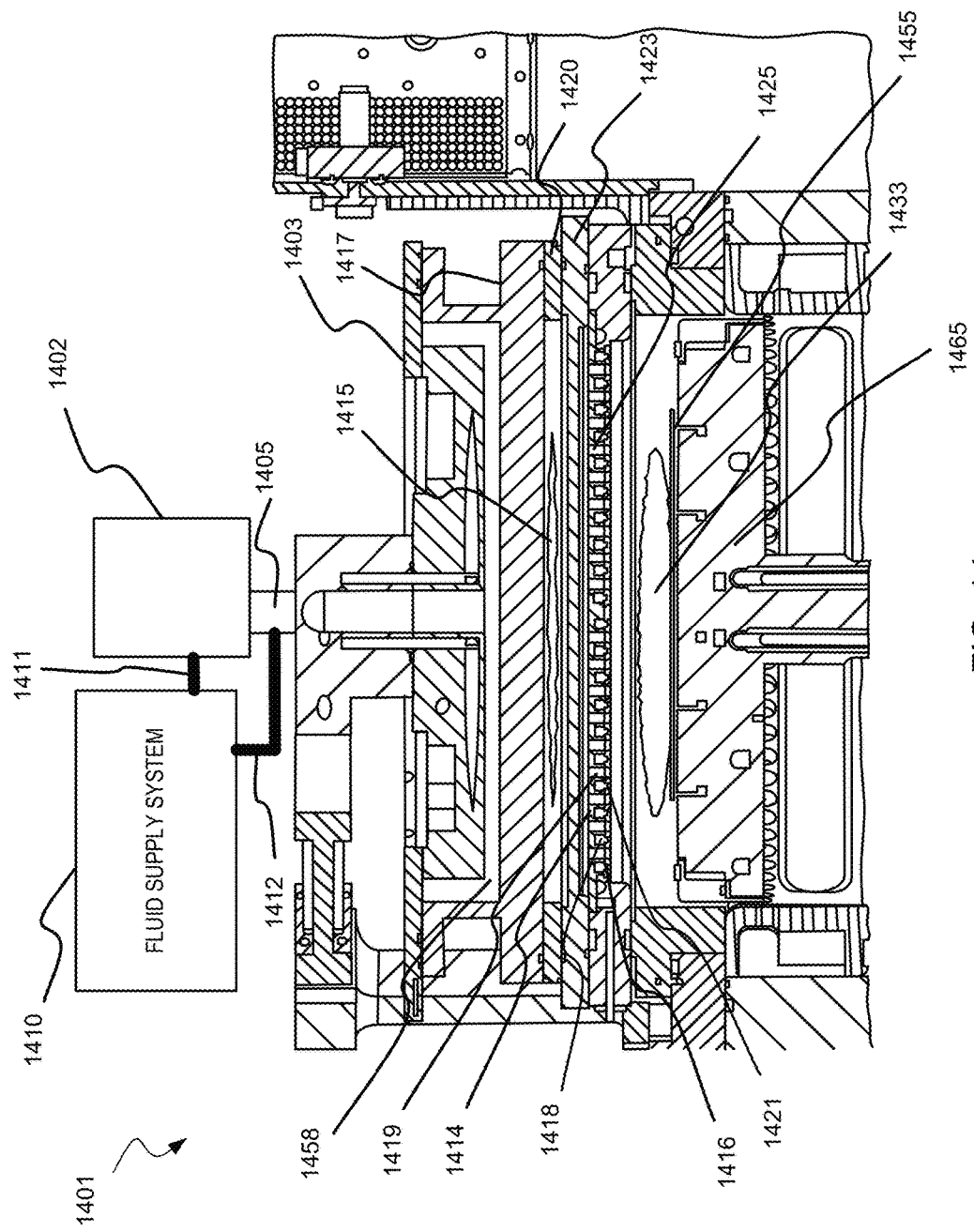
FIG. 14 shows a schematic cross-sectional view of a substrate processing chamber according to embodiments of the present technology.

FIG. 14 shows a cross-sectional view of an exemplary substrate processing chamber 1401 with a partitioned region within substrate processing chamber 1401. The partitioned region will be referred to herein as a remote chamber region owing to the partitioning relative to substrate processing region 1433. A remote plasma system (RPS) 1402 may be present on and external to substrate processing chamber 1401 as shown. RPS 1402 may be used to excite an inert gas supplied through inert supply line 1411. The plasma effluents formed in RPS 1402 then travel into effluent mixing region 1405 and combine with an oxidizing precursor supplied through oxidizing precursor supply line 1412.

A cooling plate 1403, faceplate 1417, ion suppressor 1423, showerhead 1425, and a substrate support 1465 (also known as a pedestal), having a substrate 1455 disposed thereon, are shown and may each be included according to embodiments. Pedestal 1465 may have a heat exchange channel through which a heat exchange fluid flows to control the temperature of the substrate. This configuration may allow the substrate 1455 temperature to be cooled or heated to maintain relatively low temperatures, such as between −20° C. to 200° C. Pedestal 1465 may also be resistively heated to relatively high temperatures, such as between 100° C. and 1100° C., using an embedded heater element.

Effluent mixing region 1405 opens into a gas supply region 1458 partitioned from the remote chamber region 1415 by faceplate 1417 so that the gases/species flow through the holes in the faceplate 1417 into the remote chamber region 1415. Structural and operational features may be selected to prevent significant backflow of plasma from the remote chamber region 1415 back into gas supply region 1458, effluent mixing region 1405, and fluid supply system 1410. The structural features may include the selection of dimensions and cross-sectional geometries of the apertures in faceplate 1417 to deactivate back-streaming plasma in cases where a plasma is generated in remote chamber region 1415. The operational features may include maintaining a pressure difference between the gas supply region 1458 and remote chamber region 1415 that maintains a unidirectional flow of plasma effluents through the showerhead 1425. The faceplate 1417, or a conductive top portion of the chamber, and showerhead 1425 are shown with an insulating ring 1420 located between the features, which allows an AC potential to be applied to the faceplate 1417 relative to showerhead 1425 and/or ion suppressor 1423. The insulating ring 1420 may be positioned between the faceplate 1417 and the showerhead 1425 and/or ion suppressor 1423 enabling a capacitively coupled plasma (CCP) to be formed in the remote chamber region. Remote chamber region 1415 may be referred to as a chamber plasma region when used to form the remote plasma. However, no plasma is present in remote chamber region 1415 in embodiments. The inert gas may only be excited in RPS 1402 according to embodiments.

The plurality of holes in the ion suppressor 1423 may be configured to control the passage of the activated gas, i.e., the ionic, radical, and/or neutral species, through the ion suppressor 1423. For example, the aspect ratio of the holes, or the hole diameter to length, and/or the geometry of the holes may be controlled so that the flow of ionically-charged species in the activated gas passing through the ion suppressor 1423 is reduced. The holes in the ion suppressor 1423 may include a tapered portion that faces remote chamber region 1415, and a cylindrical portion that faces the showerhead 1425. The cylindrical portion may be shaped and dimensioned to control the flow of ionic species passing to the showerhead 1425. An adjustable electrical bias may also be applied to the ion suppressor 1423 as an additional means to control the flow of ionic species through the suppressor. The ion suppression element 1423 may function to reduce or eliminate the amount of ionically charged species traveling from the plasma generation region to the substrate. Uncharged neutral and radical species may still pass through the openings in the ion suppressor to react with the substrate.

Plasma power can be of a variety of frequencies or a combination of multiple frequencies. In the exemplary processing system the remote plasma may be provided by RF power delivered to faceplate 1417 relative to ion suppressor 1423 and/or showerhead 1425. The RF power may alternatively or in combination be applied within RPS 1402. The RF power may be between 10 watts and 10,000 watts, between 10 watts and 5,000 watts, between 25 watts and 2000 watts, between 50 watts and 1500 watts, or between 250 watts and 500 watts to increase the longevity of chamber components (e.g. RPS 1402) or for processing considerations. The RF frequency applied in the exemplary processing system to the remote plasma region (chamber plasma region and/or the RPS) may be low RF frequencies less than 200 kHz, higher RF frequencies between 10 MHz and 15 MHz, or microwave frequencies greater than or about 1 GHz in embodiments. The plasma power may be capacitively-coupled (CCP) or inductively-coupled (ICP) into the remote plasma region.

Excited species derived from the inert gas in RPS 1402 and/or remote chamber region 1415 may travel through apertures in the ion suppressor 1423, and/or showerhead 1425 and react with an oxidizing precursor flowing into substrate processing region 1433 from a separate portion of the showerhead in embodiments. Little or no plasma may be present in substrate processing region 1433 during the remote plasma etch process. Excited derivatives of the precursors and inert gases may combine in the region above the substrate and/or on the substrate to etch structures or remove species from the substrate.

Figure 15:
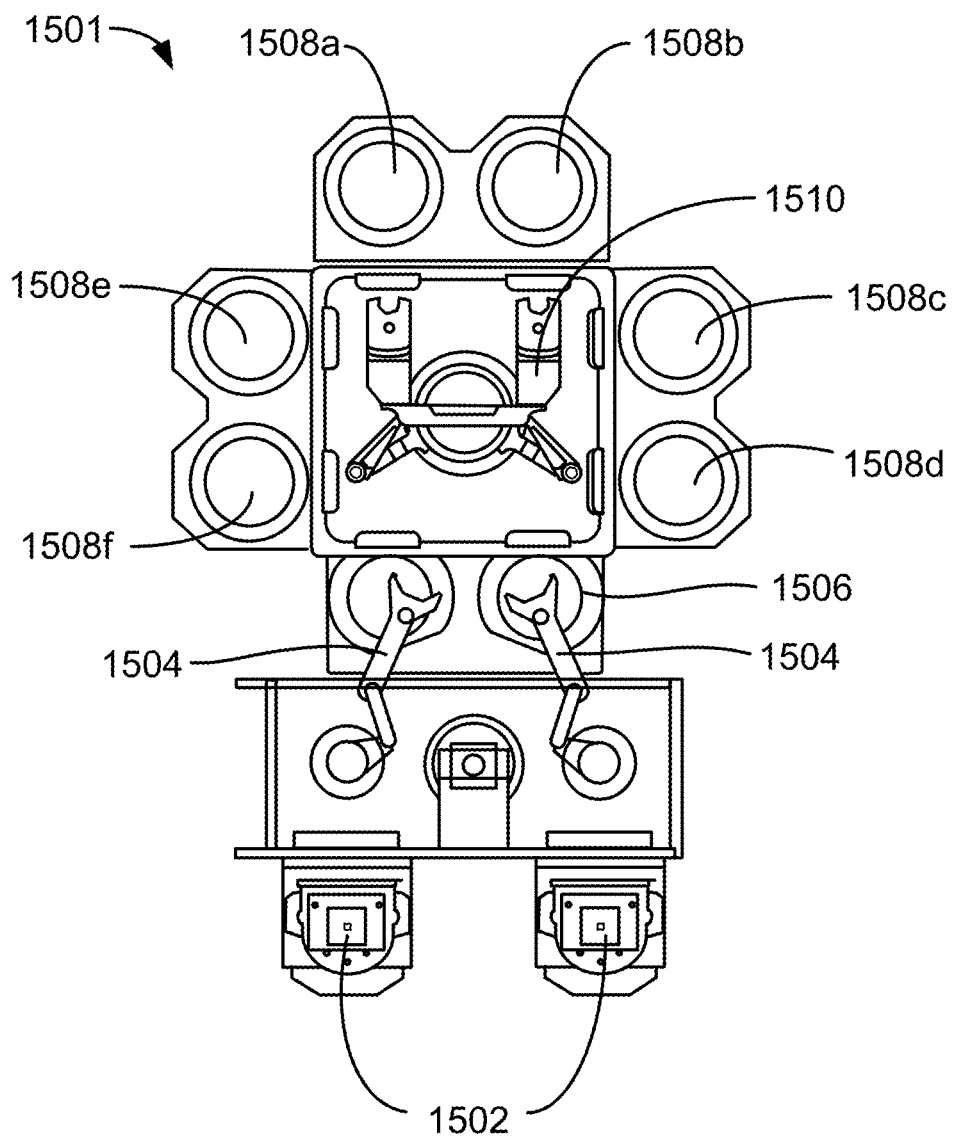
FIG. 15 shows a top view of an exemplary substrate processing system according to embodiments of the present technology.

Embodiments of the dry etch systems may be incorporated into larger fabrication systems for producing integrated circuit chips. FIG. 15 shows one such processing system (mainframe) 1501 of deposition, etching, baking, and curing chambers in embodiments. In the figure, a pair of front opening unified pods (FOUPs) (load lock chambers 1502) supply substrates of a variety of sizes that are received by robotic arms 1504 and placed into a low pressure holding area 1506 before being placed into one of the substrate processing chambers 1508*a-f*. A second robotic arm 1510 may be used to transport the substrate wafers from the holding area 1506 to the substrate processing chambers 1508*a-f* and back. Each substrate processing chamber 1508*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the layer" includes reference to one or more layers and equivalents thereof known to those skilled in the art, and so forth. The invention has now been described in detail for the purposes of clarity and understanding. However, it will be appreciated that certain changes and modifications may be practice within the scope of the appended claims.

All publications, patents, and patent applications cited herein are hereby incorporated by reference in their entirety for all purposes. None is admitted to be prior art

What is claimed is:

1. A method of forming a stack of semiconductor layers, the method comprising:
   depositing a first silicon oxide layer on a substrate;
   depositing a first silicon layer on the first silicon oxide layer;
   depositing a first silicon nitride layer on the first silicon layer;
   depositing a second silicon layer on the first silicon nitride layer; and
   depositing a stress layer on a side of the substrate opposite a side of the substrate with the first silicon oxide layer and forming the stack of semiconductor layers comprising the first silicon oxide layer, the first silicon layer, the first silicon nitride layer, and the second silicon layer.

2. The method of claim 1, wherein the stress layer is a second silicon nitride layer.

3. The method of claim 1, wherein depositing the stress layer is after the substrate is characterized by a bow exceeding a threshold value.

4. The method of claim 3, wherein after depositing the stress layer, the substrate is characterized by a bow not exceeding the threshold value.

5. The method of claim 1, wherein depositing the stress layer is after depositing the first silicon nitride layer and before depositing the second silicon layer.

6. The method of claim 1, wherein depositing the stress layer is after depositing the second silicon layer and before patterning the second silicon layer.

7. The method of claim 1, wherein depositing the first silicon oxide layer, the first silicon layer, the first silicon nitride layer, the second silicon layer, and the stress layer are by low pressure chemical vapor deposition.

8. The method of claim 1, wherein:
   the substrate is in contact with the first silicon oxide layer,
   the first silicon oxide layer is in contact with the first silicon layer,
   the first silicon layer is in contact with the first silicon nitride layer, and
   the first silicon nitride layer is in contact with the second silicon layer.

9. The method of claim 1, further comprising:
   depositing a second silicon oxide layer on the second silicon layer,
   depositing a third silicon layer on the second silicon oxide layer,
   depositing a second silicon nitride layer on the third silicon layer,
   depositing a fourth silicon layer on the second silicon nitride layer, and
   depositing the stress layer after depositing the fourth silicon layer.

10. The method of claim 9, wherein depositing the stress layer is after the substrate is characterized by a bow exceeding a threshold value.

11. The method of claim 1, further comprising removing the substrate from a processing tool.

12. The method of claim 1, wherein:
   depositing the first silicon oxide layer, depositing the first silicon nitride layer, depositing the stress layer are performed in a first chamber of a processing tool, and
   depositing the first silicon layer and depositing the second silicon layer are performed in a second chamber of the processing tool.

* * * * *